(12) United States Patent
Velichko et al.

(10) Patent No.: US 8,878,264 B2
(45) Date of Patent: Nov. 4, 2014

(54) GLOBAL SHUTTER PIXEL WITH IMPROVED EFFICIENCY

(75) Inventors: Sergey Velichko, Boise, ID (US); Jingyi Bai, San Jose, CA (US)

(73) Assignee: Aptina Imaging Corporation, George Town (KY)

( * ) Notice: Subject to any disclaimer, the term of this patent is extended or adjusted under 35 U.S.C. 154(b) by 394 days.

(21) Appl. No.: 13/173,596

(22) Filed: Jun. 30, 2011

(65) Prior Publication Data
US 2012/0273854 A1 Nov. 1, 2012

Related U.S. Application Data

(60) Provisional application No. 61/479,059, filed on Apr. 26, 2011.

(51) Int. Cl.
*H01L 27/146* (2006.01)
*H01L 21/265* (2006.01)

(52) U.S. Cl.
CPC ...... *H01L 27/1461* (2013.01); *H01L 27/14623* (2013.01); *H01L 27/14612* (2013.01); *H01L 21/26586* (2013.01)
USPC ........... 257/292; 257/290; 257/291; 257/294; 257/256; 257/257; 257/258; 257/215; 257/225; 257/229; 257/233; 257/239; 257/E27.13; 257/E27.131; 257/E27.133; 257/E27.134; 257/E27.15; 257/E27.151; 257/E27.152; 257/E27.153; 257/E27.154; 257/E27.159; 257/E27.162; 257/E21.334; 257/E31.084

(58) Field of Classification Search
None
See application file for complete search history.

(56) References Cited

U.S. PATENT DOCUMENTS

| | | | |
|---|---|---|---|
| 6,051,447 A * | 4/2000 | Lee et al. | 438/48 |
| 6,903,394 B2 * | 6/2005 | Agarwal | 257/292 |
| 7,453,514 B2 | 11/2008 | Furlan | |
| 7,638,825 B2 | 12/2009 | Hong | |
| 2003/0096442 A1 * | 5/2003 | Lee | 438/59 |
| 2004/0132262 A1 * | 7/2004 | Ayabe et al. | 438/428 |
| 2007/0018267 A1 * | 1/2007 | Altice et al. | 257/445 |
| 2007/0046796 A1 * | 3/2007 | McKee | 348/294 |
| 2009/0101796 A1 * | 4/2009 | Ladd et al. | 250/206 |
| 2009/0179232 A1 * | 7/2009 | Adkisson et al. | 257/229 |
| 2009/0200580 A1 * | 8/2009 | Rhodes et al. | 257/233 |
| 2009/0219418 A1 * | 9/2009 | Fujita | 348/243 |
| 2009/0225204 A1 * | 9/2009 | Inaba et al. | 348/273 |
| 2011/0049591 A1 * | 3/2011 | Nakatani et al. | 257/292 |
| 2012/0043589 A1 * | 2/2012 | Nozaki et al. | 257/225 |
| 2012/0326008 A1 * | 12/2012 | McKee et al. | 250/208.1 |

* cited by examiner

*Primary Examiner* — Fei Fei Yeung Lopez
(74) *Attorney, Agent, or Firm* — Kendall P. Woodruff (57) ABSTRACT

A global shutter pixel cell includes a serially connected anti-blooming (AB) transistor, storage gate (SG) transistor and transfer (TX) transistor. The serially connected transistors are coupled between a voltage supply and a floating diffusion (FD) region. A terminal of a photodiode (PD) is connected between respective terminals of the AB and the SG transistors; and a terminal of a storage node (SN) diode is connected between respective terminals of the SG and the TX transistors. A portion of the PD region is extended under the SN region, so that the PD region shields the SN region from stray photons. Furthermore, a metallic layer, disposed above the SN region, is extended downwardly toward the SN region, so that the metallic layer shields the SN region from stray photons. Moreover, a top surface of the metallic layer is coated with an anti-reflective layer.

11 Claims, 6 Drawing Sheets

GLOBAL SHUTTER PIXEL WITH IMPROVED EFFICIENCY

CROSS REFERENCE TO RELATED APPLICATIONS

This application claims priority of U.S. Provisional Patent Application Ser. No. 61/479,059, filed Apr. 26, 2011, which is incorporated herein by reference in its entirety.

FIELD OF THE INVENTION

The present invention relates, in general, to solid state imaging devices. More specifically, the present invention relates to imaging devices having a global shutter capability.

BACKGROUND OF THE INVENTION

Digital cameras sample the original light that bounces off a subject to create a digital image. A digital camera may use a shutter in combination with a sensor to determine an exposure time and acquire the proper amount of light to make a good image. The proper amount of light may come from accumulating ambient light over time until the proper amount of light is obtained. Alternatively, the addition of artificial light from a flash speeds up the amount of time, until the proper amount of light is obtained to make a good image.

In a typical mechanical shutter, the timing between scan lines of a sensor and the actuation of the shutter is such that the shutter is closed until the sensor (such as a complementary metal-oxide semiconductor (CMOS) sensor, or a charge coupled device (CCD) sensor) is ready to be exposed to the light in the picture frame. When the mechanical shutter opens, nearly 100% of the light is allowed to pass and be sensed by the light sensitive pixels in the sensor. When the mechanical shutter gives the command to close and the shutter closes, the light no longer reaches the sensor.

Some digital cameras have a mechanical shutter to control the exposure time of the CMOS sensor. Unfortunately, the inclusion of a mechanical shutter adds significant expense to the cost of a camera. Further, a mechanical shutter due to size and dimensions adds physical bulkiness to the camera.

Some cameras may have sensors implementing a global shutter timing mechanism for the light sensitive pixels. These sensors have electronic components added to each pixel location in the sensor. Typically, in a sensor implementing a global shutter timing mechanism, all the pixels begin and end their integration phase at the same time, and the intensities of all the pixels are simultaneously transferred to a light insensitive storage area at the same time. Sensors employing a global shutter timing mechanism, therefore, typically have little to no potential for motion artifacts.

Figure 1:
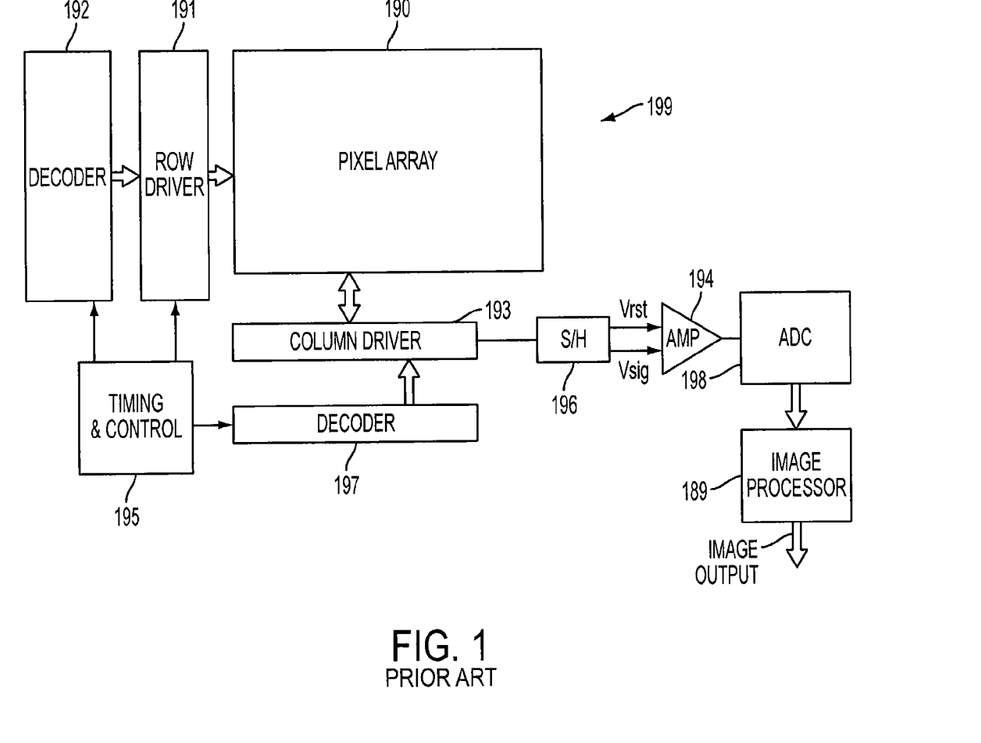
FIG. 1 is a block diagram of a conventional image sensor.

A typical single chip CMOS image sensor 199 is illustrated by the block diagram of FIG. 1. Pixel array 190 includes a plurality of pixels arranged in a predetermined number of columns and rows.

Generally, the rows of pixels in array 190 are read out one by one. Accordingly, pixels in a row of array 190 are all selected for readout at the same time by a row select line, and each pixel in a selected row provides a signal representative of received light to a readout line in its column. In array 190, each column also has a select line, and the pixels of each column are selectively read out, in response to the column select lines.

The row lines in pixel array 190 are selectively activated by a row driver 191, in response to row address decoder 192. The column select lines are selectively activated by a column driver 193, in response to column address decoder 197. The pixel array is operated by the timing and control circuit 195, which controls address decoders 192, 197 for selecting the appropriate row and column lines for pixel signal readout.

The signals on the column readout lines, typically, include a pixel reset signal (Vrst) and a pixel image signal (Vsig) for each pixel. Both signals are read into a sample and hold circuit (S/H) 196, in response to column driver 193. A differential signal (Vrst–Vsig) is produced by differential amplifier (AMP) 194 for each pixel, and each pixel's differential signal is amplified and digitized by analog-to-digital-converter (ADC) 198. The ADC 198 supplies the digitized pixel signals to an image processor 189, which can perform appropriate image processing before providing digital signals defining the image.

An electronic shutter for image sensors has been developed to serve in place of a mechanical shutter. The electronic shutter controls the amount of photo-generated charge accumulated by a pixel cell by controlling the integration time of the pixel cell. This feature is especially useful when imaging moving objects, or when the image sensor itself is moving and a shortened integration time is necessary for quality images.

Typically, a pixel cell having an electronic shutter includes a shutter transistor and a storage device, which is typically a pn-junction capacitor. The storage device stores a voltage representative of the charge generated by a photo-conversion device in the pixel cell. The shutter transistor controls when, and for how long, charge is transferred to the storage device. This controls the integration time of the pixel cell.

There are two typical modes of operation for an electronic shutter, namely, rolling shutter and global shutter. When an electronic shutter operates as a rolling shutter, each row of pixels in the array integrates photo-generated charge, one at a time, and each row is read out one at a time. When an electronic shutter operates as a global shutter, all pixels in the array integrate photo-generated charge simultaneously, and each row is read out one at a time.

Global shuttering provides advantages over row shuttering. Essentially, global shuttering is able to provide a "snap shot" of the imaged object. Consequently, global shuttering offers increased accuracy of an imaged object, with uniform exposure time and uniform image content.

On the other hand, because the pixel cells of the pixel array are read out row by row, pixel cells in a row, that are read out last, must store photo-generated charge in their respective storage devices longer, than pixel cells in rows that are read out earlier. These storage devices may lose charge over time, and the longer these storage devices must store photo-generated charge, there is more charge that is lost. Therefore, charge loss is especially problematic for pixel cells in the last read row. When charge is lost by a pixel cell, the resultant image may have a poor quality, or may be distorted.

Additionally, a common problem associated with active pixel imager cells, when operated in global shutter modes, is that storage devices, or storage nodes (SNs), accumulate parasitic charges while holding charge transferred from each photodiode (PD). This lowers the global shutter pixel efficiency and results in appearance of vertical shading; a moving object may also have smears and shadings. Accordingly, what is needed is a pixel cell with an electrical shutter having improved charge transfer efficiency, minimal charge loss, and reduced accumulation of parasitic charges.

BRIEF DESCRIPTION OF THE FIGURES

The invention may be understood from the following detailed description when read in connection with the accompanying figures.

DETAILED DESCRIPTION OF THE INVENTION

As will be explained, the present invention provides pixel cells with one or any combination of the following features for increasing global shutter pixel efficiency:
 a. a photodiode (PD) implanted deeper and under an angle covering space under a storage node (SN);
 b. the bottom portion of the PD is expanded sideways;
 c. a high voltage potential to the PD is applied during pixel storage time;
 d. a high dose p-type implant is included in the p-substrate, immediately below the SN, in order to lower the probability of parasitic charges diffusing to the SN;
 e. a smaller distance is provided between a metal shield and the SN to limit the amount of light directly flowing into the SN area;
 f. metal lines are covered with black material, such as titanium nitride (TiN), in order to limit reflections to the SN area; and
 g. less light transparent dielectric, such as hydrogen infused silicon nitride (Si3N4), used everywhere outside of PD area.

Figure 2:
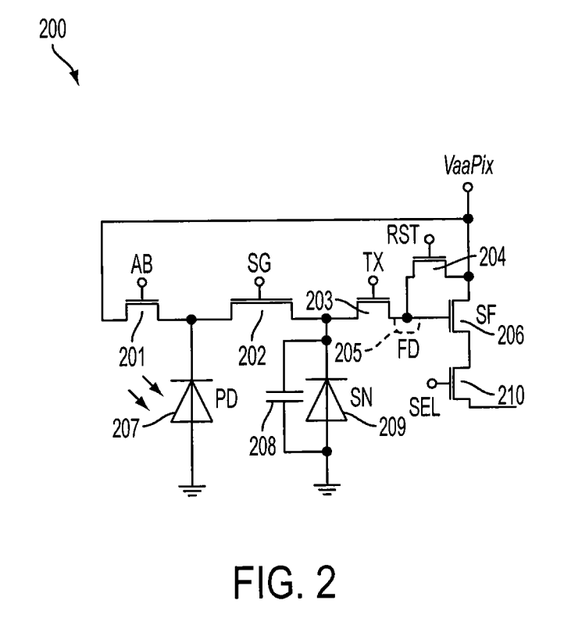
FIG. 2 is a global shutter pixel cell forming part of the image sensor shown in FIG. 1, in which the global shutter pixel cell is configured in accordance with an embodiment of the present invention.

Referring first to FIG. 2, there is shown a global shutter pixel, generally designated as 200. The global shutter pixel, it will be appreciated, is one of multiple global shutter pixels arranged in rows and columns of an imager array, such as pixel array 190 shown in FIG. 1.

Each pixel 200 includes a photosensor, for example, a pinned photodiode, or a photogate for accumulating photo-generated charges in a specified portion of the pixel's substrate. As shown, pixel 200 includes a photosensor, which is implemented as a pinned photodiode (PD), designated as 207. Pixel 200 also includes storage gate (SG) transistor 202, storage node (SN) region 209, anti-blooming (AB) transistor 201, transfer gate (TX) transistor 203, floating diffusion (FD) region 205, reset (RST) transistor 204, source follower (SF) transistor 206 and row select (SEL) transistor 210.

The PD 207 is connected to SN region (diode) 209 by SG transistor 202, when the SG transistor is activated by a global storage control signal, SG control. The SN region is connected to FD region 205 via TX transistor 203, during the time when the TX transistor is activated by a transfer gate control signal, TX control.

The RST transistor 204 is connected between FD region 205 and a pixel supply voltage, VaaPix. A reset control signal, RST control, is used to activate RST transistor 204, which resets FD region 205 to the pixel supply voltage level of VaaPix. Additional activation of the TX and RST transistors resets SN region 209 to the pixel supply level of VaaPix. The SF transistor 206 has its gate connected to FD region 205 and its source and drain terminals connected between supply voltage VaaPix and SEL transistor 210.

The SF transistor 206 converts the charge stored at the FD region into an electrical voltage output signal. The SEL transistor 210 is controlled by a row select signal, SEL control, for selectively connecting the SF transistor and its output voltage signal to a column line of the pixel array. The AB transistor 201 connects PD diode 207 to the supply voltage VaaPix during the time that the AB control signal is applied to the AB transistor.

A common problem associated with active pixel imager cells, such as pixel cell 200 of FIG. 1, is that when it is operated in a global shutter mode, SN region 209 accumulates parasitic charges while holding charge transferred from PD diode 207. The accumulation of charge lowers the global shutter pixel efficiency and results in vertical shading, as well as object smearing. The parasitic charges may be accumulated by storage node 209 and its associated capacitance 208. These parasitic charges are dominated by photon induced parasitic current, as well as charges generated by photons directly within the SN region.

Figure 3:
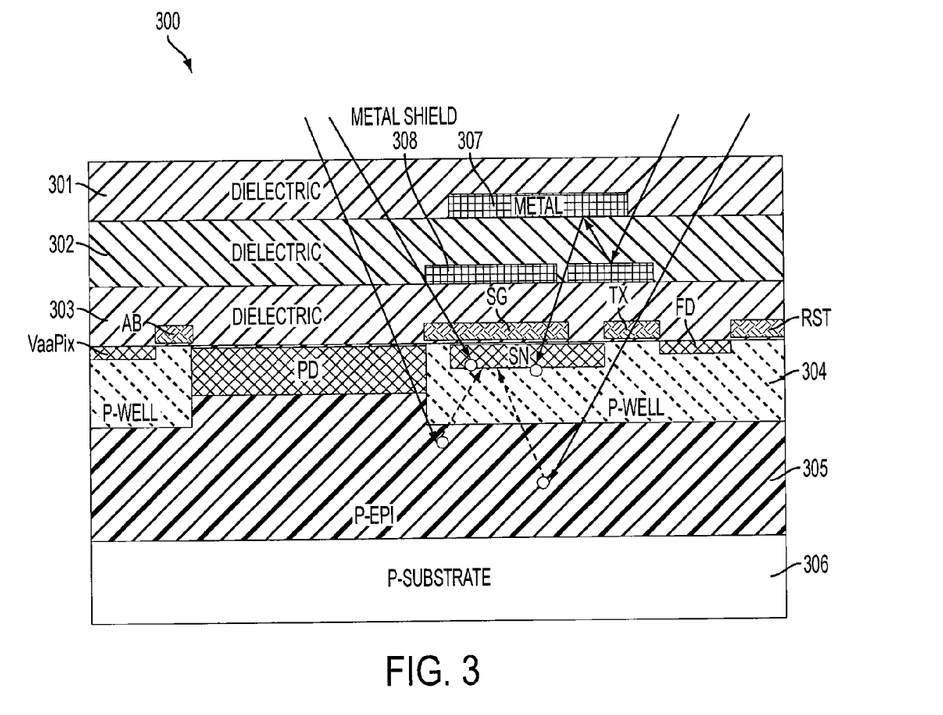
FIG. 3 is a cross-sectional view of a conventional global shutter pixel cell forming part of an image sensor in a semiconductor chip.

Referring next to FIG. 3, there is shown a cross-sectional view of pixel cell 300, which may be included on a semiconductor chip as part of an integrated circuit. It will be understood that any pixel cell described herein, in connection with examples of the present invention, may be included on a semiconductor chip. For simplicity, only pixel cell 300 is depicted as part of the semiconductor chip.

As shown in FIG. 3, pixel cell 300 is a global shutter pixel with highlighted parasitic current sources that lower global shutter efficiency. For clarity, gate contacts, many dielectric layers and many metal layers have been omitted. Included, however, are dielectric layers 301, 302 and 303 containing metal layers 307 and 308, as indicated. Also included is P-well region 304, which is embedded in epitaxial layer 305, the latter disposed above P-substrate 306.

Various elements of pixel cell 200 (FIG. 2) are shown in a cross-sectional view in FIG. 3. Viewing FIG. 3 from left to right, there are the VaaPix node, the anti-bloom gate AB, the storage gate SG, the transfer gate TX, and the reset gate RST. The pinned photodiode region PD is disposed below and between the AB gate and the SG gate. The SN region is located below and under the SG gate; and the FD region is located below and between the transfer gate TX and the reset gate RST.

As may clearly be seen in FIG. 3, photons may pass around, or via metal shield gaps, reflecting from metal layers, and may hit the SN region directly to generate parasitic charges. A majority of the parasitic charges are generated below or on the sides of the SN region. These parasitic charges may diffuse easily into the SN region, thus resulting in lower shutter efficiency and image degradation.

In order to increase global shutter pixel efficiency, the present invention implements the following modifications (these modifications may be a single modification or may be a combination of the listed modifications):

(1) Implant the PD region deeper and under an angle covering the space under the SN region; expand sideways the bottom portion of the PD region so that it is under the SN region; and apply a high voltage potential to the PD region during pixel storage time.

(2) Implant a high dose p-type isolation region in the p-substrate, immediately below the SN region to lower the probability of parasitic charges diffusing to the SN region.

(3) Provide a smaller distance between the metal shield and the SN region to limit the amount of light that directly goes into the SN region; and cover the metal lines with black material, such as titanium nitride (TiN) in order to limit reflections going to the SN region.

(4) Use a dielectric material outside of the PD area that is less transparent to light than silicon oxide (SiO2), such as hydrogen infused silicon nitride (Si3N4), to cover the space between the metal layers that may be dictated by layout constraints.

Figure 4:
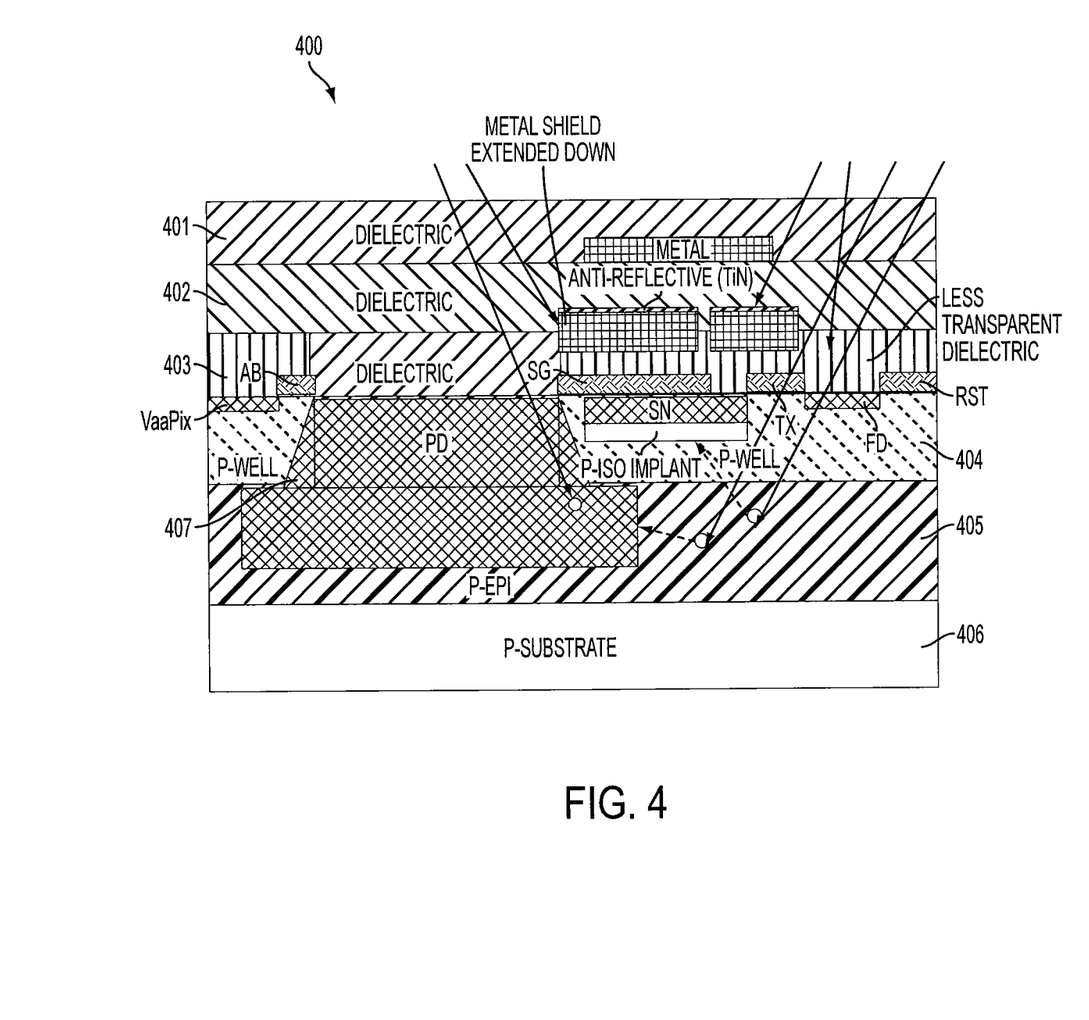
FIG. 4 is a cross-sectional view of a global shutter pixel cell, configured in accordance with an embodiment of the present invention.

Referring next to FIG. 4, there is shown an example of an embodiment of the present invention. FIG. 4 includes dielectric layers 401, 402 and 403, as well as P-well region 404, epitaxial layer 405 and p-substrate layer 406, which are similar to elements 301-306 shown in FIG. 3. Differences between the two figures, however, are highlighted below. These differences contribute to obtaining a global shutter pixel cell having lower parasitic storage node (SN) charges.

As shown in FIG. 4, the PD region is extended downwardly into the epitaxial layer 405. In addition, the PD region is widened, so that it extends under the SN region. In extending the PD region sideways and under the SN region, an angled region, designated as 407, is formed. By extending the PD region toward and below the SN region, the amount of bulk photocurrent that may flow to the SN region is significantly limited. Instead of flowing to the SN region, the photocurrent flows to the PD region.

In addition, by applying a positive potential to the PD region during storage time (as described with respect to FIG. 5), parasitic current flows away from the SN region. This may be achieved, for example, by connecting the cathode of PD 207 to VaaPix, upon activation of AB transistor 201.

Furthermore, by adding a high dose P-isolation implant directly below the SN region, as shown in FIG. 4, the probability of parasitic charges diffusing to the SN region from below is further reduced.

Further still, as shown in FIG. 4, providing a smaller distance between the metal shield and the SN region allows less light to pass directly to the SN region. Also shown as a further possible implementation, the present invention may add anti-reflective black material, such as titanium nitride (TiN), to limit the amount of reflected light flowing to the SN region. Additionally, a less transparent dielectric layer (for example, hydrogen infused silicon nitride (Si3N4), located immediately above the SN region limits the amount of light that may also generate parasitic current.

Figure 5:
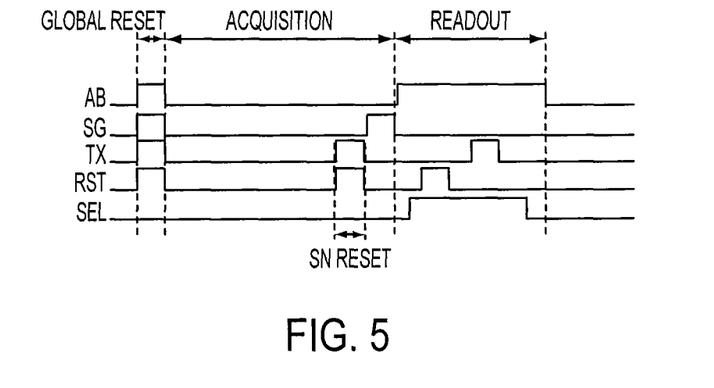
FIG. 5 is a timing diagram of the operation of the global shutter pixel cell shown in FIG. 2, in accordance with an embodiment of the present invention.

In an embodiment of the present invention, FIG. 5 illustrates signal timing for the global shutter pixel. Operation of the pixel begins with a global reset phase, when the PD, FD and SN structures are connected to VaaPix via the AB, SG, TX and RST gates upon applying corresponding AB, SG, TX and RST control signals.

Upon completion of the global reset phase, an acquisition phase begins, when the PD region collects photon generated charges. The acquisition phase is finished with the global SG control signal when it transfers the PD charges to the SN region (within each pixel) for storage. Before this PD to SN charge transfer, all SN regions are discharged completely by connecting the SN regions to the VaaPix terminal via the TX and RST transistors.

Upon completion of the charge transfer from PD to SN, the AB transistor is connected to VaaPix to allow parasitic generated current to flow away from the pixel, thus increasing shutter efficiency. Additionally, the AB transistor, when connected to the VaaPix terminal, prevents any pixel blooming effect.

During the readout phase, charge stored in the SN region of each pixel in the array is read out by completing a full correlated double sampling (CDS). This is achieved by first connecting the FD region to the VaaPix terminal via the RST transistor, and then performing the FD reset voltage level readout; and, subsequently, connecting the SN region to the FD region via the TX transistor and reading the FD signal level. Potential difference between the FD reset and the signal levels is directly proportional to the SN charge and represents the level of charge accumulated by the PD region during the acquisition phase.

It will be appreciated that, as shown in FIGS. 2 and 5, the SN region is set to VaaPix during the global reset phase, when the AB transistor and the SG transistor are activated. In addition, the SN region is reset during the acquisition phase, when the TX transistor and the RST transistor are activated.

The aforementioned modifications to the global shutter pixel decreases parasitic storage node quantum efficiency during the storage time, due to the PD and SN changes described above, and consequently, improves global shutter efficiency multiple times. It will be appreciated, however, that the aforementioned changes need not be all implemented into the global shutter pixel. Any one change or a combination of changes also result in increased global shutter efficiency.

Figure 6:
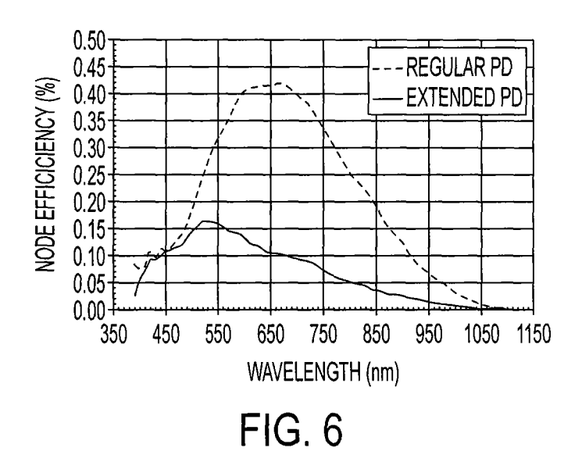
FIG. 6 is a plot of storage node parasitic quantum efficiency versus wavelength.
Figure 7:
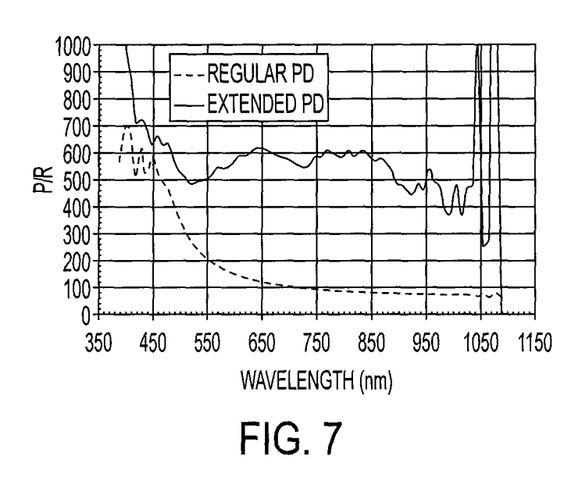
FIG. 7 is a plot of the ratio of pixel quantum efficiency to parasitic storage node quantum efficiency versus wavelength.

Turning lastly to FIGS. 6 and 7, improvements in global shutter efficiency are shown by comparing a conventional PD region with an extended PD region. The extended PD region has a decreased parasitic storage node quantum efficiency during the storage time (FIG. 6) and increased global shutter efficiency (FIG. 7).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A pixel cell comprising:
a photodiode (PD) region in a semiconductor for generating charge, and
a storage node (SN) region in the semiconductor, selectively connected to the PD region, for holding a charge transferred from the PD region,
wherein a top portion of the PD region is implanted adjacent to a side of the SN region,
a bottom portion of the PD region is extended under the SN region,
the bottom portion of the PD region is effective in reducing parasitic charges diffusing to the SN region,
a P-well region is implanted under the SN region, and
a high dose p-type isolation region is implanted in the P-well region, and is disposed under the SN region for reducing parasitic charges diffusing to the SN region,
wherein the top portion of the PD region is smaller in width than the bottom portion of the PD region, and a side of the top portion of the PD region is connected to the bottom portion of the PD region by an angular section extending under the SN region.

2. The pixel cell of claim 1 wherein
a storage gate (SG) of a transistor is disposed above the SN region, and the SG is immersed within a first dielectric layer;
a metallic layer is disposed above the SG and the SN region, and the metallic layer is immersed within a second dielectric layer; and the metallic layer is extended in a depth dimension, into the first dielectric layer, for reducing parasitic charges diffusing to the SN region.

3. The pixel cell of claim 1 wherein
a metallic layer disposed above the SN region is coated with an anti-reflective layer for reducing parasitic charges diffusing to the SN region.

4. The pixel cell of claim 3 wherein
the metallic layer is coated with a titanium nitride (TiN) layer.

5. The pixel cell of claim 1 wherein
a dielectric layer disposed above the SN region includes hydrogen infused silicon nitride (Si3N4) for reducing parasitic charges diffusing to the SN region.

6. The pixel cell of claim 1 wherein
a voltage is applied to the PD region, after the PD region is finished transferring the charge from the PD region to the SN region.

7. A global shutter pixel cell comprising:
serially connected anti-blooming (AB) transistor, storage gate (SG) transistor and transfer (TX) transistor, wherein the SG is immersed within a first dielectric layer,
the serially connected transistors coupled between a voltage supply and a floating diffusion (FD) region,
a terminal of a photodiode (PD) connected between respective terminals of the AB and the SG transistors, and
a terminal of a storage node (SN) diode connected between respective terminals of the SG and the TX transistors,
wherein a region of the PD is extended about a region of the SN diode, so that the region of the PD shields the region of the SN diode from stray photons,
the region of the PD is extended below and under the region of the SN diode, and
a metallic layer, disposed above the SN diode, is extended downwardly toward the SN diode, so that the metallic layer shields the SN diode from stray photons, wherein the metallic layer is immersed within a second dielectric layer and wherein the metallic layer extends into the first dielectric layer in a depth dimension.

8. The global shutter pixel cell of claim 7 wherein
a top surface of the metallic layer is coated with an anti-reflective layer.

9. The global shutter pixel cell of claim 7 wherein the first dielectric layer, disposed above the SN diode, includes material for forming a partially non-transparent dielectric layer, so that the first dielectric layer shields the SN diode from stray photons.

10. The global shutter pixel of claim 9 wherein the material for forming the partially non-transparent dielectric layer is hydrogen infused silicon nitride (Si3N4).

11. The global shutter pixel cell of claim 7 wherein the voltage supply is connected to the terminal of the PD, by activating the AB transistor, after the SN includes charge transferred from the PD.

\* \* \* \* \*